(12) United States Patent
Miyakita

(10) Patent No.: US 6,970,007 B2
(45) Date of Patent: Nov. 29, 2005

(54) SEMICONDUCTOR DEVICE LOW TEMPERATURE TEST APPARATUS USING ELECTRONIC COOLING ELEMENT

(75) Inventor: Shigeru Miyakita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 443 days.

(21) Appl. No.: 10/404,081

(22) Filed: Apr. 2, 2003

(65) Prior Publication Data

US 2003/0197518 A1  Oct. 23, 2003

(30) Foreign Application Priority Data

Apr. 23, 2002 (JP) ......... 2002-120548

(51) Int. Cl.$^7$ .............. G01R 31/26
(52) U.S. Cl. .......... 324/765; 324/760; 62/3.7
(58) Field of Search .......... 324/158.1, 703, 324/685, 670, 760, 224, 441, 431; 62/3.2, 3.7, 73, 79

(56) References Cited

U.S. PATENT DOCUMENTS 5,188,982 A * 2/1993 Huang .......... 228/123.1
6,334,311 B1 * 1/2002 Kim et al. .......... 62/3.2

FOREIGN PATENT DOCUMENTS

JP  53-50982  5/1978

* cited by examiner

*Primary Examiner*—Nestor Ramirez
*Assistant Examiner*—Trung Q. Nguyen
(74) *Attorney, Agent, or Firm*—Staas & Halsey LLP

(57) ABSTRACT

A semiconductor device test apparatus, has: a socket, which connects to a semiconductor device undergoing testing mounted thereon; a test tray, which houses the semiconductor device undergoing testing and which is provided, in a position on which the semiconductor device undergoing testing is mounted, with a first electronic cooling element that absorbs heat via one surface thereof and releases heat via the other surface thereof; and a contact block, which is provided with a second electronic cooling element that makes contact with the top of the semiconductor device undergoing testing in a state in which the semiconductor device undergoing testing is mounted on the socket.

7 Claims, 5 Drawing Sheets

SEMICONDUCTOR DEVICE LOW TEMPERATURE TEST APPARATUS USING ELECTRONIC COOLING ELEMENT

CROSS-REFERENCE TO RELATED APPLICATIONS

This application is based upon and claims the benefit of priority from the prior Japanese Patent Application No. 2002-120548, filed on Apr. 23, 2002, the entire contents of which are incorporated herein by reference.

BACKGROUND OF THE INVENTION

1. Field of the Invention

The present invention relates to a semiconductor device low temperature test apparatus, and more particularly to a low temperature test apparatus that prevents a drop in measurement quality resulting from the generation of frost, dispenses with the conventional thermostatic chamber to thereby miniaturize the apparatus, and shortens the turn-around time.

2. Description of the Related Art

A shipping test for a semiconductor integrated circuit device such as an LSI (referred to as an IC hereinbelow) includes a high temperature test step and a low temperature test step. Generally, the operation of the IC is ensured over a comparatively broad temperature range from a high temperature to a low temperature. Accordingly, a shipping test requires a high temperature test step of checking whether or not operation is normal in a high temperature atmosphere of 90° C., for example, and a low temperature test step of checking whether or not operation is normal in a low temperature atmosphere of −15° C., for example. Ordinarily, operational defects often occur in a high temperature atmosphere, however, for example, in the case of flash memory and the like, a drop in the power source level in a low temperature atmosphere sometimes leads to a defect such that programming operations cannot be performed normally. It is therefore necessary to perform a low temperature test in order to eliminate such a defect.

Disposed in a conventional shipping test line are: a high temperature test apparatus comprising a thermostatic chamber maintained in a high temperature atmosphere, and a low temperature test apparatus comprising a thermostatic chamber maintained in a low temperature atmosphere. A plurality of ICs undergoing testing, which are placed in a test tray, are introduced to the respective thermostatic chamber of the high temperature test apparatus and the low temperature test apparatus; the ICs undergoing testing are connected in turn to an internal socket, and predetermined operational tests are performed.

Where the high temperature test apparatus is concerned, the thermostatic chamber is provided with a heater, the test tray is introduced via the delivery door, and the tray is discharged via the discharge door. Similarly, with regard to the low temperature test apparatus, a liquid nitrogen bath is connected to the thermostatic chamber, and a low temperature atmosphere is produced by this liquid nitrogen.

A conventional low temperature test apparatus has a structure in which liquid nitrogen is employed to produce a low temperature atmosphere within the thermostatic chamber, and therefore temperature control of the IC undergoing testing takes time. In addition, the thermostatic chamber must also be provided with a constitution to pre-cool the IC undergoing testing before the IC undergoing testing is connected to a socket to perform the test, as well as a temperature recovery constitution for returning the IC undergoing testing to a normal temperature following the test. There is thus the problem of an increase in size of the test apparatus.

Further, in order to prevent the generation of frost in the thermostatic chamber, a baking process is required in the thermostatic chamber so as to eliminate moisture in the thermostatic chamber, before a low temperature state is established for the thermostatic chamber and after same has been restored to a normal temperature state. The waiting time required for the temperature drop which corresponds to the accompanying temperature rise induces a decrease in the throughput of the test apparatus.

Furthermore, even after performing this baking process within the thermostatic chamber, when, after the thermostatic chamber has dropped to a low temperature, testing is implemented continually over a long period, frost is generated in the sections of the connection terminals of the measurement IC socket in the thermostatic chamber, whereby a short circuit results between the connection terminals. In the test steps, at the time of a contact test to check for a connection defect between the IC undergoing testing and the measurement IC socket, and of a leak test to check for a short-circuiting defect between the terminals of the IC undergoing testing, a connection is confirmed, despite there being a connection defect, due to a short circuit caused by frost on the socket connection terminals, or a short circuit defect is detected even in the absence of a short circuit between the IC terminals, respectively, whereby the test quality is dropped.

In order to prevent the above problem, there is a requirement to periodically release the low temperature state of the thermostatic chamber and perform a baking process on the interior thereof, and such a periodic baking process also lowers the throughput of the test apparatus.

Conventionally, a low temperature test apparatus not equipped with a thermostatic chamber is disclosed by Japanese Patent Application Laid-open No. S53-50982. This low temperature test apparatus has a constitution that supplies a low temperature atmosphere generated by Peltier elements to an IC undergoing testing via a heat pipe and that performs cooling as a result of the heat pipe pressing against the top face of the IC undergoing testing. However, in this method, the IC undergoing testing is cooled indirectly by the Peltier elements and the IC undergoing testing cannot be cooled highly accurately or in a short time. In addition, the generation of frost on the connection terminals of the socket cannot be avoided.

SUMMARY OF THE INVENTION

Accordingly, it is an object of the present invention to provide a low temperature test apparatus that prevents a drop in measurement quality resulting from the generation of frost, dispenses with the conventional thermostatic chamber to thereby miniaturize the apparatus, and shortens the turn-around time.

In order to achieve the above object, one aspect of the present invention is a semiconductor device test apparatus, comprising: a socket, which connects to a semiconductor device undergoing testing mounted thereon; a test tray, which houses the semiconductor device undergoing testing and which is provided, in a position on which the semiconductor device undergoing testing is mounted, with a first electronic cooling element that absorbs heat via one surface thereof and releases heat via the other surface thereof; and a contact block, which is provided with a second electronic cooling element that makes contact with the top of the semiconductor device undergoing testing in a state in which the semiconductor device undergoing testing is mounted on the socket. The semiconductor device undergoing testing is, housed in the test tray and the bottom side of the semiconductor device undergoing testing is pre-cooled by means of the first electronic cooling element; the test tray is mounted on the socket and a test is implemented while cooling the bottom side of the semiconductor device undergoing testing that is mounted on the socket by means of the first electronic cooling element and cooling the top side of the semiconductor device by means of the second electronic cooling element respectively; and, after completion of the test, the semiconductor device undergoing testing is heated by means of the first electronic cooling element of the test tray.

According to the above aspect of the invention, because the semiconductor device undergoing testing is cooled via the top side and the bottom side thereof by means of electronic cooling elements, the thermostatic chamber is unnecessary and miniaturization of the test apparatus is thus possible. Moreover, the low temperature environment range is minimized to the range of the semiconductor device undergoing testing and temperature control can be performed highly accurately. In addition, it is possible to heat the socket which is on the opposite side from the bottom side of the semiconductor device undergoing testing, by means of the first electronic cooling element, whereby the generation of frost on the socket can be prevented.

Further, moisture can be removed and the generation of frost can be suppressed by keeping the atmosphere in the vicinity of the semiconductor device undergoing testing at a high temperature by means of the first and second electronic cooling elements. More particularly, suppressing the generation of frost on the connection terminals of the socket raises the test quality and hence obviates the need to periodically perform a baking process, which is the conventional frost countermeasure. Further, after the test is complete, the temperature recovery step can also be performed by heating the semiconductor device undergoing testing by means of the first electronic cooling element of the test tray, and miniaturization of the test apparatus is thus made feasible.

DESCRIPTION OF THE PREFERRED EMBODIMENTS

Figure 1:
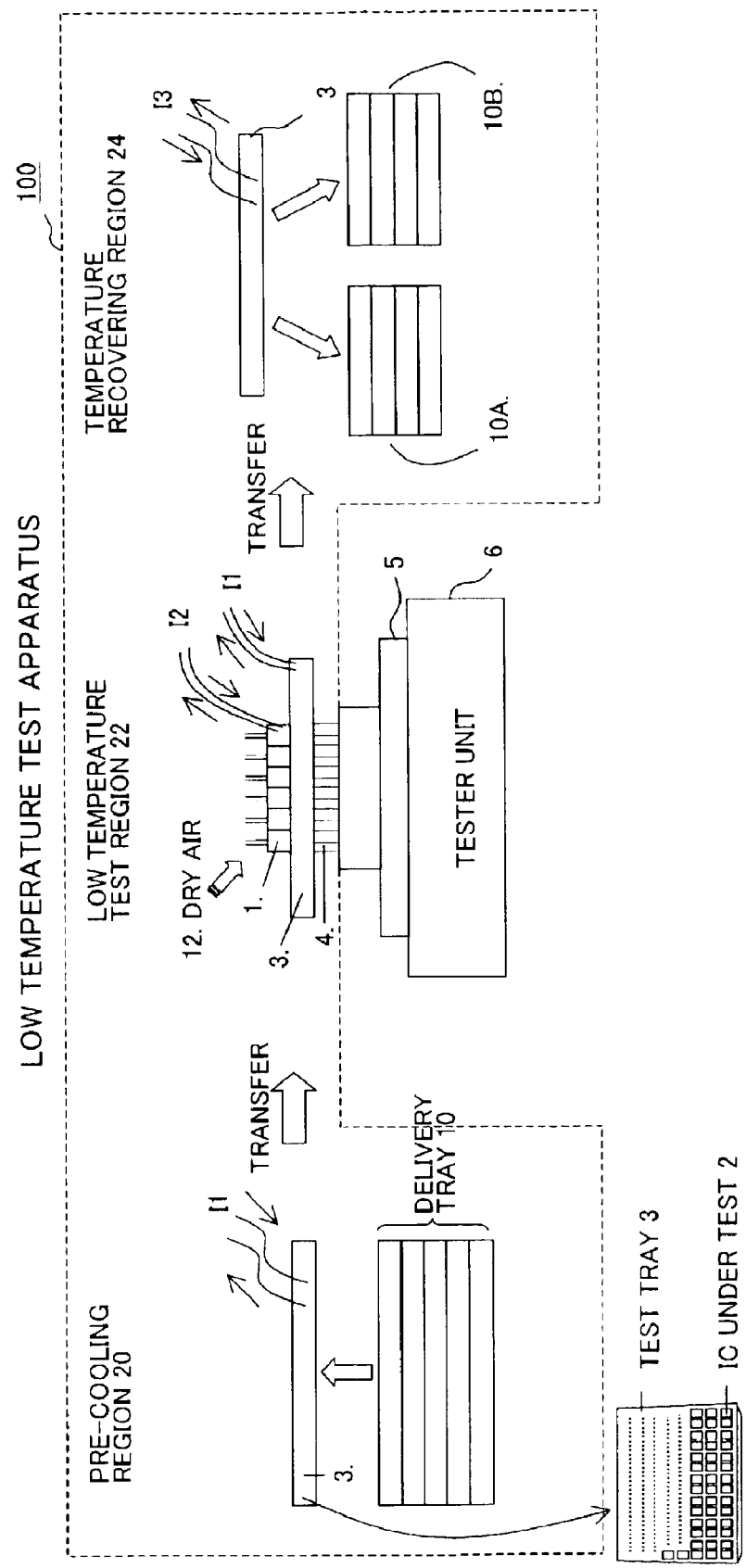
FIG. 1 is a constitutional view of the low temperature test apparatus according to the present embodiment.

A description of an embodiment of the present invention will be described below referring to the drawings. However, the scope of protection of the present invention is not limited to or by the embodiment below but rather is intended to cover the inventions appearing in the claims as well as any equivalents thereof.

FIG. 1 is a constitutional view of the low temperature test apparatus according to the present embodiment. This low temperature test apparatus 100 is constituted from a low temperature test region 22 in which a tester unit 6 is connected; a pre-cooling region 20 for pre-cooling an IC undergoing testing; and a temperature recovery region 24 for restoring the IC undergoing testing to a normal temperature after the test is complete. In the low temperature test region 22, the tester unit 6 is connected, the tester unit 6 being provided with a measurement board 5, and a measurement IC socket 4, which is connected to the measurement board 5, is provided.

A delivery tray 10 that houses an IC undergoing testing 2 is introduced to the low temperature test apparatus 100. The IC undergoing testing, which is in the delivery tray 10, is transferred to the test tray 3 by a loader and the like (not shown), in the pre-cooling region 20, and the IC undergoing testing 2 is pre-cooled by means of an electronic cooling element which is provided in the test tray 3 and will be described hereinafter. A Peltier element, for example, may be used as the electronic cooling element.

When pre-cooling is complete, the test tray 3 is delivered to the measurement IC socket 4 of the low temperature test region 22 and the IC undergoing testing 2 housed in the test tray 3 is mounted on the measurement IC socket 4. Then, by applying pressure to the IC undergoing testing 2 by means of a contact block 1, the connection terminals of the IC undergoing testing 2 are pushed onto and connected to the connection terminals of the socket 4, whereupon a low temperature test is performed by means of the tester unit 6. Thereupon, the IC undergoing testing is also cooled via the top side thereof by means of the electronic cooling element of the contact block 1. Means (not shown) for supplying dry air 12 are provided in the low temperature region 22 and the atmosphere of the low temperature test region is thus kept at a low temperature.

When the test is complete, the test tray 3 is delivered once again and, in the temperature recovery region 24, the IC undergoing testing is heated and restored to a normal temperature by means of the electronic cooling element in the test tray. By switching the current direction of the electronic cooling element, the IC undergoing testing can be cooled or heated. Thereafter, depending on the test result, a non-defective IC is transferred to a non-defective product shipping tray 10B and a defective IC is transferred to a defective product tray 10A.

An outline of the constitution of the low temperature test apparatus was provided above. Rather than providing the low temperature test apparatus with a conventional thermostatic chamber that uses liquid nitrogen, the Peltier element in the test tray 3 and the Peltier element of the contact block 1 are caused to make contact with the IC undergoing testing such that the IC undergoing testing is cooled. Also, pre-cooling of the IC undergoing testing and temperature recovery for same are performed by means of the Peltier element provided in the test tray 3.

The Peltier element that constitutes the electronic cooling element has a constitution in which P-type and N-type semiconductors are thermally juxtaposed and connected electrically in series such that an electric current is made to flow therethrough. This flow of electric current causes the surface in which current flows from P to N and the surface in which current flows from N to P to release heat or absorb heat respectively. Accordingly, the heat-absorbing surface and heat-releasing surface can be switched by switching the current direction.

Figure 2:
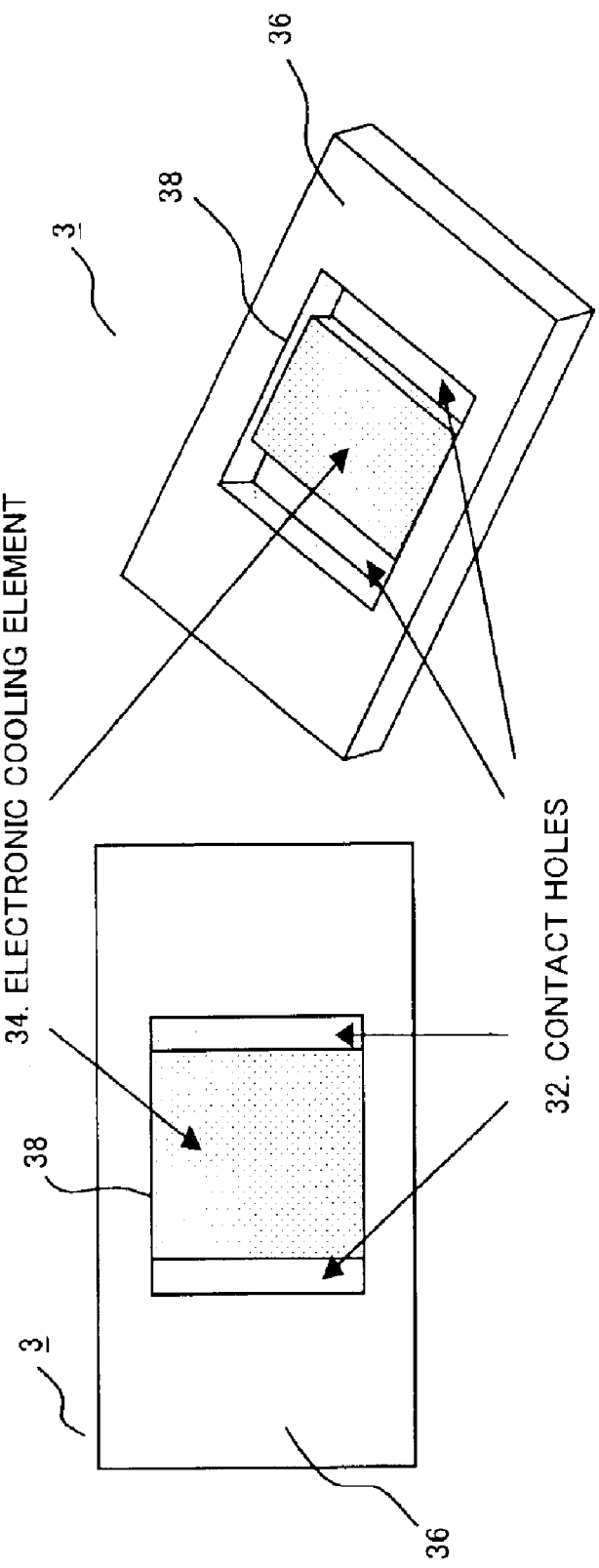
FIG. 2 is a constitutional view of the test tray according to the present embodiment.

FIG. 2 is a constitutional view of the test tray according to the present embodiment. FIG. 2A is a top side view and FIG. 2B is a perspective view. The test tray 3 comprises an IC-housing portion 38 in a main body 36. In the example of FIG. 2, only one housing portion 38 is provided but a plurality of housing portions are provided in the actual test tray, whereby a plurality of ICs undergoing testing can be housed.

In the IC housing portion 38, two contact holes 32 are provided in parallel which permit the external terminals of an IC housed in the IC housing portion 38 to protrude at the bottom side of the main body 36, and an electronic cooling element 34 constituted from a Peltier element is provided between these contact holes 32. Therefore, when the IC undergoing testing is housed within the IC housing portion 38, the bottom side section of the IC undergoing testing is mounted on the electronic cooling element 34.

Figure 3:
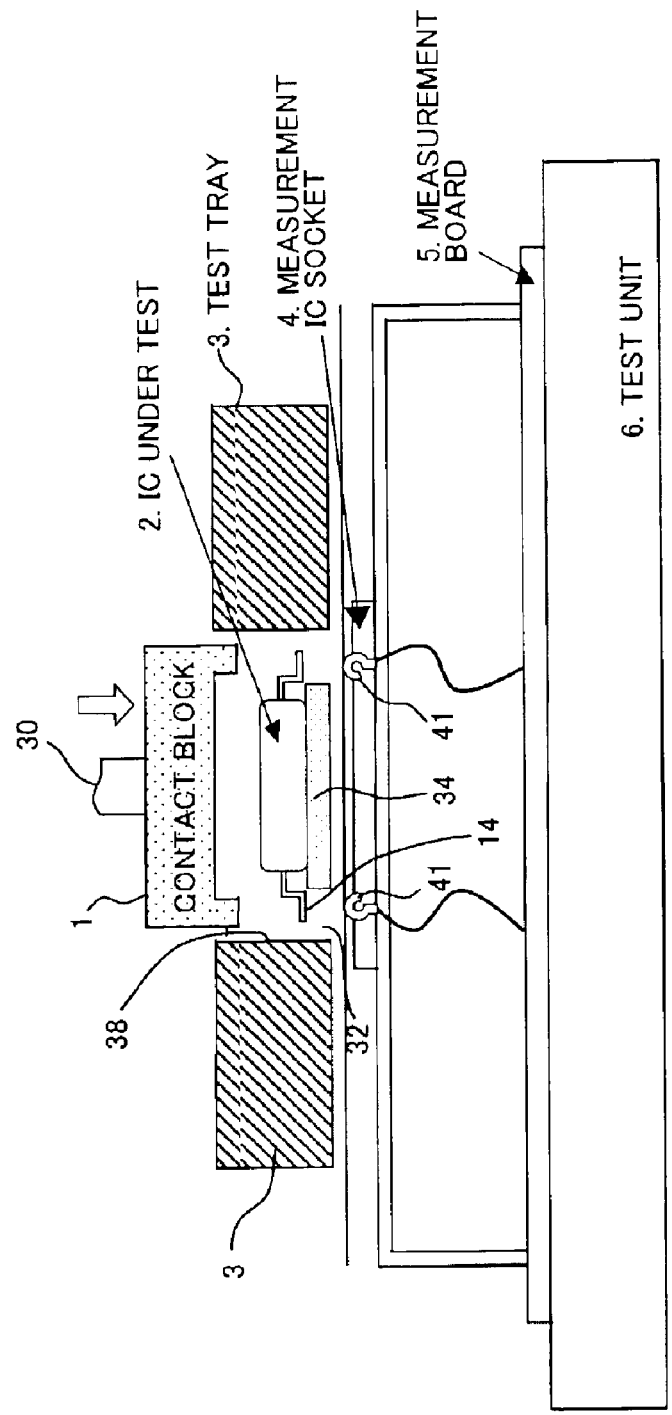
FIG. 3 is a cross-sectional view illustrating the relationship between the IC undergoing testing that is mounted in the test tray, and the measurement IC socket and the contact block.

FIG. 3 is a cross-sectional view illustrating the relationship between the IC undergoing testing that is mounted in the test tray, and the measurement IC socket and contact block. As illustrated in FIG. 1, provided in the low temperature test region 22 are: the measurement board 5, which is connected to the tester unit 6, and the measurement IC socket 4. The connection terminals 41 of the measurement IC socket 4 are connected to the connection terminals (not shown) of the measurement board 5.

The bottom side of the IC undergoing testing 2 housed in the housing portion 38 of the test tray 3 is mounted on the electronic cooling element 34 of the test tray 3. The external terminals 14 of the IC undergoing testing 2 make contact with the connection terminals 41 of the measurement IC socket 4 via the contact holes 32 of the test tray 3. In this state, the contact block 1, which comprises the electronic cooling element (Peltier element) and is mounted at the tip of an arm 30 is inserted in the housing portion 38, presses against the top side of the IC undergoing testing 2 as well as the external terminals 14 thereof to thus permit the external terminals 14 to reliably contact the socket connection terminals 41. In addition, as a result of the heat-absorbing action of the contact block 1, the top side of the IC undergoing testing 2 is cooled.

Figure 4:
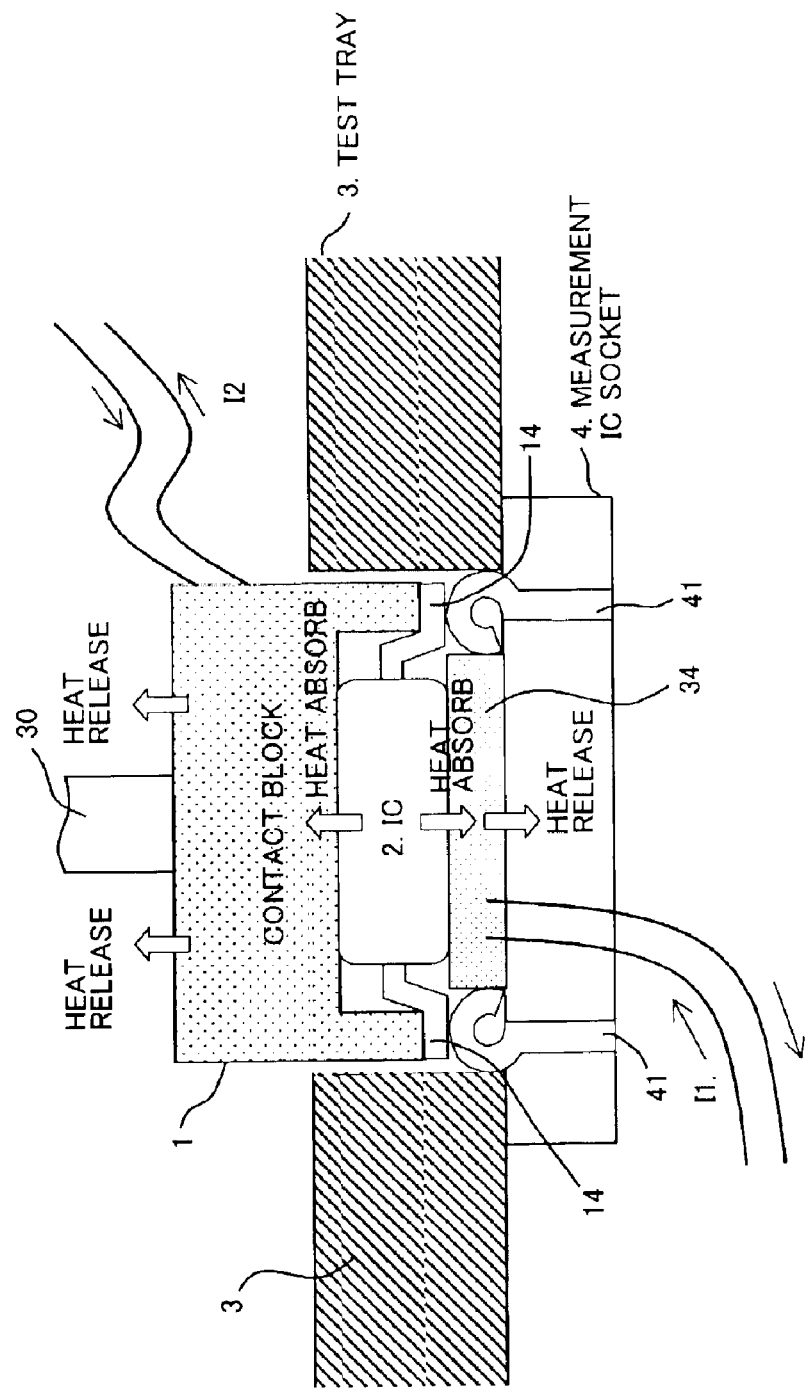
FIG. 4 is a cross-sectional view illustrating the relationship between the IC undergoing testing in a cooled test state, the test tray, the measurement IC socket and the contact block.

FIG. 4 is a cross-sectional view illustrating the relationship between the IC undergoing testing in a cooled test state, the test tray, the measurement IC socket and the contact block. As described earlier, as a result of pressing the contact block 1 via the top side of the IC undergoing testing, the external terminals 14 of the IC undergoing testing reliably contact the connection terminals 41 of the socket 4 and the bottom side of the IC undergoing testing adheres to the electronic cooling element 34 of the test tray 3 and the top side of the IC undergoing testing adheres to the contact block 1.

When a current I1 is made to flow in the electronic cooling element 34 of the test tray 3, the top side of the electronic cooling element 34 is controlled to assume a heat-absorbing state and the bottom side thereof is controlled to assume a heat-releasing state. Also, when a current I2 is also made to flow in the electronic cooling element of the contact block 1, the bottom side of this electronic cooling element is controlled to assume a heat-absorbing state and the top side thereof is controlled to assume a heat-releasing state. The IC undergoing testing is thus cooled via the bottom side and the top side thereof. In addition, the connection terminals 41 of the measurement IC socket are heated under the heat-releasing action of the bottom side of the electronic cooling element 34, whereby the generation of frost is suppressed. Furthermore, because the top side of the contact block 1 is in a heat-releasing state, the surrounding atmosphere is also heated and moisture is eliminated. Accordingly, the IC undergoing testing 2 alone is restrictedly cooled, and the remaining measurement IC socket 4 and the surroundings are heated.

Figure 5:
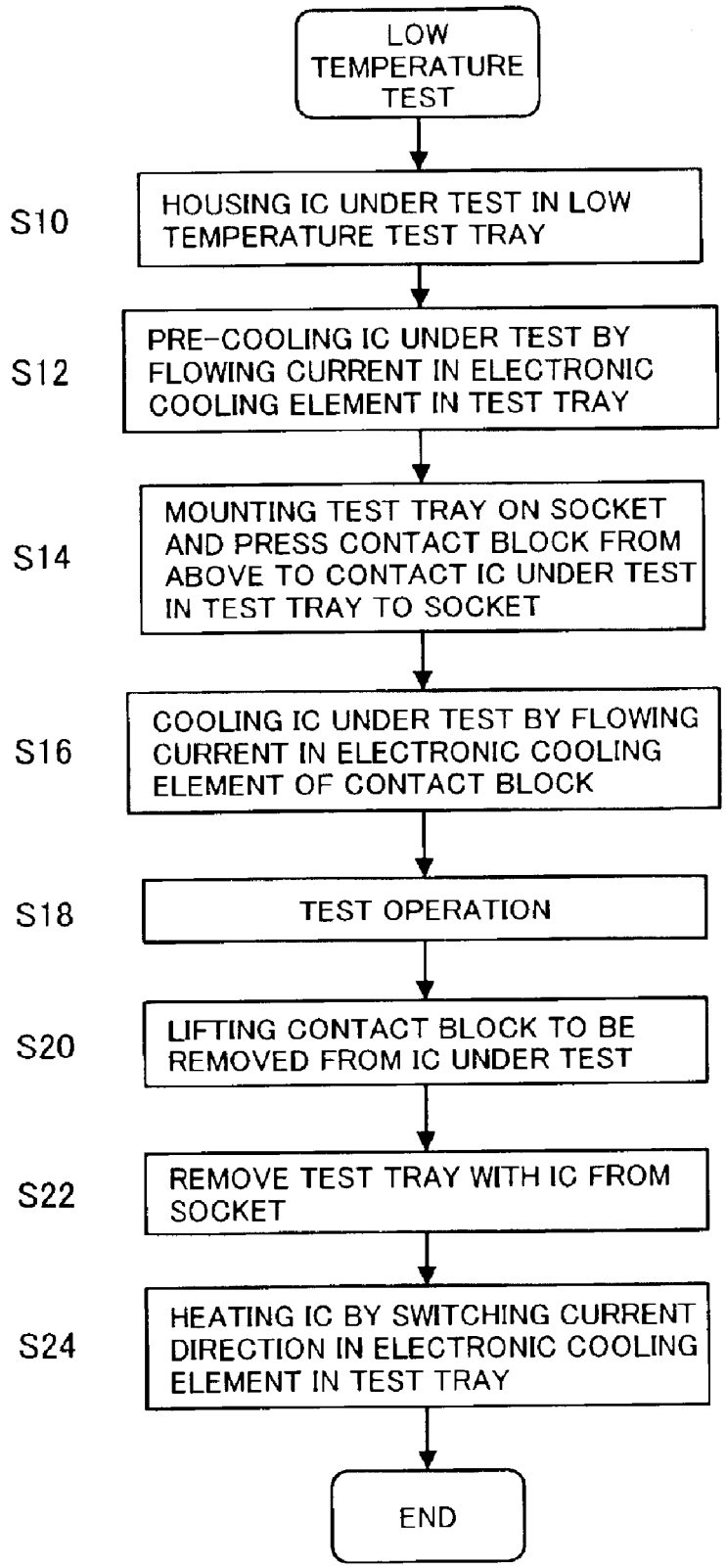
FIG. 5 is a flowchart showing the low temperature test steps that employ the low temperature test apparatus according to the present embodiment.

FIG. 5 is a flowchart showing the low temperature test steps that employ the low temperature test apparatus according to the present embodiment. As shown in FIG. 1, the delivery tray 10, which houses a plurality of ICs undergoing testing 2, is introduced to the low temperature test apparatus 100 and the ICs undergoing testing are housed within the test tray 3 and stacked in the pre-cooling region 20 (S10). There, a current is made to flow in the electronic cooling element 34 in the test tray 3 so that the top side of the electronic cooling element assumes a heat-absorbing state, whereby pre-cooling of the IC undergoing testing is performed (S12).

Thereafter, the test tray 3, having undergone a certain amount of pre-cooling, is delivered to the low temperature test region 22 and the test tray 3 is mounted on the measurement IC socket 4. Then, as shown in FIG. 3, the contact block 1 is inserted into the housing portion 38 of the tray 3 from above so as to press against the top side of the IC undergoing testing and the external terminals 14 of the socket (S14). As a result, as shown in FIG. 4, the top side of the IC undergoing testing 2 makes intimate contact with the electronic cooling element of the contact block 1 and the bottom side of the IC undergoing testing makes intimate contact with the electronic cooling element 34 in the test tray. The external terminals 14 of the IC undergoing testing 2 make intimate contact with the connection terminals 41 of the measurement IC socket 4.

The contact block 1 is constituted from an electronic cooling element, a current being made to flow therethrough such that the bottom side of the contact block assumes a heat-absorbing state and the top side thereof assumes a heat-releasing state, whereby the top side of the IC undergoing testing 2 is cooled (S16). In this state, the bottom side of the IC undergoing testing 2 is cooled by the Peltier element 34 in the tray, while the top side is cooled by the Peltier element of the contact block 1. The target of the cooling is the IC undergoing testing 2 alone which, by virtue of having a small volume, permits highly accurate temperature control thereof. Also, on account of the pre-cooling, the time taken to cool the IC undergoing testing 2 to the test temperature can be shortened.

In this state, the tester unit 6 implements an operational test (S18). The operational test involves, for example, varying the power source voltage in a cooled state to check the power source margin which permits normal operation. It is thus possible to detect errors generated in a low temperature state.

In this state, the bottom side of the Peltier element 34 of the test tray 3 is in a heat-releasing state, meaning that the measurement IC socket 4 is heated. Therefore, the generation of frost on the connection terminals of the socket 4 is avoided, and it is possible to prevent a decline in the measurement quality of the contact test and the leak test, and so forth, due to a short circuit between the terminals that accompanies the generation of frost. The top side of the contact block 1 also assumes a heat-releasing state, which also results in a reduction in the surrounding moisture.

Further, the provision of a mechanism serving to blow dry air 12 from above the contact block 1 serves to more completely implement a moisture countermeasure.

Upon completion of an operational test by means of the tester unit, the contact block 1 is lifted upward and cooling of the IC undergoing testing 2 from above ends (S20). The test tray 3 housing the IC undergoing testing 2 is removed from the measurement IC socket 4 and delivered as far as the temperature recovery region 24 (S22). Thereupon, as a result of switching the direction of the current to the Peltier element 34 of the test tray 3, the top side of the Peltier element 34 assumes a heat-releasing state. Thus, the IC undergoing testing 2 mounted on the Peltier element 34 is heated and is restored from a cooled state to a normal temperature state (S24).

After the IC undergoing testing 2 has been restored to a normal temperature, as shown in FIG. 1, a defective IC is transferred to a defective product tray 10A and a non-defective IC is transferred to a non-defective product shipping tray 10B, whereupon these trays are discharged from the low temperature test apparatus. The low temperature test steps described above are thus completed.

As described above, in the above embodiment, because an electronic cooling element is employed in order to lower the temperature of the IC undergoing testing, the test apparatus does not require a thermostatic chamber. Further, the electronic cooling element is disposed in the test tray such that, at the time of pre-cooling, the IC undergoing testing is cooled, and at the time of a low temperature test, the connection terminals of the measurement IC socket are heated while the IC undergoing testing is cooled, whereby the generation of frost is prevented. Furthermore, at the time of temperature recovery, the IC undergoing testing can be heated by switching the direction of the current in the electronic cooling element. Also, as a result of the contact block also being constituted from an electronic cooling element, the area surrounding the IC undergoing testing can be heated while the IC undergoing testing is cooled and it is possible to reduce the surrounding moisture, whereby the generation of frost can be suppressed.

In the above embodiment, provided that adequate cooling can be performed by means of the electronic cooling element in the test tray, it is possible to also dispense with usage of an electronic cooling element in the contact block 1. Alternatively, by using, in the pre-cooling region, an additional electronic cooling element that provides cooling via the top side of the IC undergoing testing, in addition to the electronic cooling element in the test tray, it is also possible to dispense with the usage of an electronic cooling element in the contact block 1.

According to the present invention described hereinabove, it is possible to miniaturize the test apparatus by obviating the need for a thermostatic chamber and to suppress the generation of frost on the measurement IC socket, which makes it possible to provide a low temperature test apparatus that raises the operational test quality and shortens the turnaround time.

What is claimed is:

1. A semiconductor device test apparatus, comprising:

a socket, which connects to a semiconductor device undergoing testing that is mounted on the socket; and a test tray, which houses the semiconductor device undergoing testing and which is provided, in a position on which the semiconductor device undergoing testing is mounted, with a first electronic cooling element that absorbs heat via one surface thereof and releases heat via the other surface thereof, wherein the semiconductor device undergoing testing is housed in the test tray and the bottom side of the semiconductor device undergoing testing is pre-cooled by the first electronic cooling element; the test tray is mounted on the socket and a test is implemented while cooling a bottom side of the semiconductor device undergoing testing, which is mounted on the socket, by the first electronic cooling element; and, after completion of the test, the semiconductor device undergoing testing is heated by the first electronic cooling element of the test tray.

2. The semiconductor device test apparatus according to claim 1, further comprising:

a contact block, which causes a second electronic cooling element to make contact with a top side of the semiconductor device undergoing testing in a state in which the semiconductor device undergoing testing is mounted on the socket, wherein, at the time of implementing the test, the top side of the semiconductor device undergoing testing is cooled by the second electronic cooling element.

3. The semiconductor device test apparatus according to claim 2, wherein the first and/or second electronic cooling element(s) comprise(s) a heat-absorbing surface and a heat-releasing surface, and the heat-absorbing surface and heat-releasing surface can be switched by switching a current direction therein.

4. The semiconductor device test apparatus according to claim 2, wherein the first and/or second electronic cooling element(s) is (are) a Peltier element.

5. The semiconductor device test apparatus according to claim 3, wherein, while the test is being implemented, the surface of the first electronic cooling element which corresponds to the socket assumes a heat-releasing state.

6. The semiconductor device test apparatus according to claim 1, wherein the test tray comprises housing portions for housing a plurality of semiconductor devices undergoing testing, and the first electronic cooling elements are provided in the housing portions and in the positions in which the semiconductor devices undergoing testing are mounted.

7. The semiconductor device test apparatus according to claim 1, further comprising a tester unit to which the socket is connected.

* * * * *